United States Patent
Li

(10) Patent No.: US 11,908,359 B2
(45) Date of Patent: Feb. 20, 2024

(54) DRIVING CIRCUIT AND DISPLAY DEVICE

(71) Applicant: TCL CHINA STAR OPTOELECTRONICS TECHNOLOGY CO., LTD., Shenzhen (CN)

(72) Inventor: Wenfang Li, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 337 days.

(21) Appl. No.: 17/294,800

(22) PCT Filed: Apr. 16, 2021

(86) PCT No.: PCT/CN2021/087829
§ 371 (c)(1),
(2) Date: May 18, 2021

(87) PCT Pub. No.: WO2022/213416
PCT Pub. Date: Oct. 13, 2022

(65) Prior Publication Data
US 2023/0142849 A1 May 11, 2023

(30) Foreign Application Priority Data
Apr. 7, 2021 (CN) .......................... 202110371943.5

(51) Int. Cl.
*G09G 3/00* (2006.01)
*H01L 25/16* (2023.01)

(52) U.S. Cl.
CPC ......... *G09G 3/006* (2013.01); *G09G 2330/04* (2013.01); *H01L 25/167* (2013.01)

(58) Field of Classification Search
CPC ............... G09G 3/006; G09G 2330/04; G09G 2330/02; G09G 2330/12; H01L 25/167
See application file for complete search history.

(56) References Cited

U.S. PATENT DOCUMENTS

| 2016/0260374 A1* | 9/2016 | Inoue | G09G 3/3696 |
| 2022/0068175 A1* | 3/2022 | Dong | G09G 3/32 |
| 2022/0357030 A1* | 11/2022 | Li | H02J 7/0024 |

FOREIGN PATENT DOCUMENTS

| CN | 107610666 A | 1/2018 |
| CN | 108231022 A | 6/2018 |
| CN | 108696964 A | 10/2018 |
| CN | 109410807 A | 3/2019 |

(Continued)

*Primary Examiner* — Douglas M Wilson
(74) *Attorney, Agent, or Firm* — The Roy Gross Law Firm, LLC; Roy Gross

(57) ABSTRACT

The present disclosure provides a driving circuit and a display device. An output control module of the driving circuit includes a first resistor, a second resistor, a third resistor, and a switching control unit. The switching control unit connected in series with the third resistor is connected in parallel with the second resistor, and then connected in series with the first resistor. During a first state, the switching control unit is turned off, and the driving circuit outputs a voltage Vout1. During a second state, the switching control unit is turned on, and the driving circuit outputs a voltage Vout2. An absolute value of Vout2 is greater than an absolute value of Vout1.

13 Claims, 1 Drawing Sheet

(56) References Cited

FOREIGN PATENT DOCUMENTS

| | | |
|---|---|---|
| CN | 109410880 A | 3/2019 |
| CN | 109637404 A | 4/2019 |
| CN | 109727587 A | 5/2019 |
| CN | 109862661 A | 6/2019 |
| CN | 209400648 U | 9/2019 |
| CN | 210837105 U | 6/2020 |
| CN | 113160730 A | 7/2021 |
| WO | 2019102597 A1 | 5/2019 |

\* cited by examiner

DRIVING CIRCUIT AND DISPLAY DEVICE

CROSS REFERENCE TO RELATED APPLICATIONS

This application is a National Phase of PCT Patent Application No. PCT/CN2021/087829 having International filing date of Apr. 16, 2021, which claims the benefit of priority of Chinese Patent Application No. 202110371943.5, filed Apr. 7, 2021, the contents of which are all incorporated herein by reference in their entirety.

BACKGROUND

Field of Invention

The present disclosure relates to the field of display, and more particularly, to a driving circuit and a display device.

Description of the Prior Art

As people's requirements for display effect of display devices become increasingly higher, mini LEDs have become a current application trend of high-end display devices. Mini LEDs are composed of a plurality of light panels. Due to a manufacturing process, light boards have certain damages. During a lighting test of the light boards, small damages to the light boards cannot be easily found, but as a lighting time increases, abnormalities of the light boards will appear, resulting in abnormal display, and then leading to customer complaints or returns.

SUMMARY

The present disclosure provides a driving circuit and a display device. A test voltage of a lighting test is increased, so that a minor damage to a light board of a mini LED can be exposed in time during the lighting test. It is conducive to timely remove defective products, improve a quality of shipments, and reduce an occurrence of customer complaints or returns.

The present disclosure provides a driving circuit, including: a power control module and an output control module, wherein an output end of the power control module is connected to an input end of the output control module, and the output control module includes:

a first resistor;
a second resistor;
a third resistor; and
a switching control unit, wherein the switching control unit connected in series with the third resistor is connected in parallel with the second resistor and then connected in series with the first resistor;
when the driving circuit is in a first state, the switching control unit is turned off, a branch where the third resistor is disposed is disconnected, the first resistor and the second resistor are connected in series, and the driving circuit outputs a voltage Vout1;
when the driving circuit is in a second state, the switching control unit is turned on, the branch where the third resistor is disposed is turned on, the third resistor is connected in parallel with the second resistor and then connected with the first resistor, and the driving circuit outputs a voltage Vout2;
wherein an absolute value of the Vout2 is greater than an absolute value of the Vout1.

Optionally, in some embodiments of the present disclosure, the switching control unit is a dial switch.

Optionally, in some embodiments of the present disclosure, the switching control unit includes at least a metal oxide semiconductor (MOS) transistor, a dial switch, and a resistor, wherein the dial switch and the resistor are connected in series to generate a branch, the MOS transistor is connected in series with third resistor, a gate electrode of the MOS transistor is connected to the branch, and a gate voltage of the MOS transistor is controlled by a conduction of the branch.

Optionally, in some embodiments of the present disclosure, an end of the branch is connected to an input voltage, another end of the branch is grounded, and the dial switch is disposed between a voltage input end of the branch and the gate electrode of the MOS transistor.

Optionally, in some embodiments of the present disclosure, the switching control unit includes the MOS transistor, the dial switch, and the resistor.

Optionally, in some embodiments of the present disclosure, a first end of the dial switch is connected to the input voltage, a second end of the dial switch is connected to a first end of the resistor and the gate electrode of the MOS transistor, and a second end of the resistor is grounded.

Optionally, in some embodiments of the present disclosure, the switching control unit includes the MOS transistor, the dial switch, an indicator light, a fourth resistor, and a fifth resistor, and the dial switch, the fourth resistor, the indicator light, and the fifth resistor connected in series form a branch.

Optionally, in some embodiments of the present disclosure, a first end of the fourth resistor is connected to the input voltage, a second end of the fourth resistor is connected to a first end of the indicator light, a second end of the indicator light is connected to a first end of the dial switch, a second end of the dial switch is connected to a first end of the fifth resistor and the gate electrode of the MOS transistor, and a second end of the fifth resistor is grounded.

Optionally, in some embodiments of the present disclosure, a first end of the fourth resistor is connected to the input voltage, a second end of the fourth resistor is connected to a first end of the dial switch, a second end of the dial switch is connected to the first end of the indicator light and the gate electrode of the MOS transistor, and a second end of the indicator light is connected to a first end of the fifth resistor, and the second end of the fifth resistor is grounded.

Optionally, in some embodiments of the present disclosure, an input end of the power control module is connected to a first external power source, and is connected to a first end of the first resistor and an output end of the driving circuit, the output end of the power control module is connected to a second end of the first resistor, a first end of the second resistor, and a first end of the third resistor, a second end of the second resistor is grounded, a first end of the MOS transistor is connected to a second end of the third resistor, a second end of the MOS transistor is grounded, a first end of the branch where the dial switch is disposed is connected to a second external power source, and a second end of the branch where the dial switch is disposed is grounded.

Optionally, in some embodiments of the present disclosure, an input end of the power control module is connected to a first external power source, a first output end of the power control module is connected to a first end of the first resistor and grounded, a second output end of the power control module is connected to a second end of the first resistor, a first end of the second resistor, and a first end of the third resistor, a first end of the MOS transistor is connected to a second end of the third resistor, a third output end of the power control module is connected to a second end of the second resistor, a second end of the MOS transistor, and a first end of the branch where the dial switch is disposed, and an output end of the driving circuit, and a second end of the branch where the dial switch is disposed is grounded.

Optionally, in some embodiments of the present disclosure, the driving circuit further includes a voltage stabilizing module, an end of the voltage stabilizing module is connected to the power control module, and another end is connected to a first end of the first resistor to ensure a stability of the output voltage of the driving circuit.

Optionally, in some embodiments of the present disclosure, the voltage stabilizing module includes at least one of a capacitor or an inductor.

Correspondingly, an embodiment of the present disclosure further provides a display device, including a driving circuit, wherein the driving circuit includes: a power control module and an output control module, wherein an output end of the power control module is connected to an input end of the output control module, and the output control module includes:

a first resistor;
a second resistor;
a third resistor; and
a switching control unit, wherein the switching control unit connected in series with the third resistor is connected in parallel with the second resistor and then connected in series with the first resistor;
when the driving circuit is in a first state, the switching control unit is turned off, a branch where the third resistor is disposed is disconnected, the first resistor and the second resistor are connected in series, and the driving circuit outputs a voltage Vout1;
when the driving circuit is in a second state, the switching control unit is turned on, the branch where the third resistor is disposed is turned on, the third resistor is connected in parallel with the second resistor and then connected with the first resistor, and the driving circuit outputs a voltage Vout2;
wherein an absolute value of the Vout2 is greater than an absolute value of the Vout1.

Optionally, in some embodiments of the present disclosure, the switching control unit is a dial switch.

Optionally, in some embodiments of the present disclosure, the switching control unit includes at least a MOS transistor, a dial switch, and a resistor, wherein the dial switch and the resistor are connected in series to generate a branch, the MOS transistor is connected in series with third resistor, a gate electrode of the MOS transistor is connected to the branch, and a gate voltage of the MOS transistor is controlled by a conduction of the branch.

Optionally, in some embodiments of the present disclosure, an end of the branch is connected to an input voltage, another end of the branch is grounded, and the dial switch is disposed between a voltage input end of the branch and the gate electrode of the MOS transistor.

Optionally, in some embodiments of the present disclosure, a first end of the dial switch is electrically connected to the voltage input end, and a second end of the dial switch is electrically connected to a first end of the resistor and the gate electrode of the MOS transistor.

Optionally, in some embodiments of the present disclosure, an input end of the power control module is connected to a first external power source, and is connected to a first end of the first resistor and an output end of the driving circuit, the output end of the power control module is connected to a second end of the first resistor, a first end of the second resistor, and a first end of the third resistor, a second end of the second resistor is grounded, a first end of the MOS transistor is connected to a second end of the third resistor, a second end of the MOS transistor is grounded, a first end of the branch where the dial switch is disposed is connected to a second external power source, and a second end of the branch where the dial switch is disposed is grounded.

Optionally, in some embodiments of the present disclosure, the input end of the power control module is connected to a first external power source, a first output end of the power control module is connected to a first end of the first resistor and grounded, a second output end of the power control module is connected to a second end of the first resistor, a first end of the second resistor, and the first end of the third resistor, a first end of the MOS transistor is connected to a second end of the third resistor, a third output end of the power control module is connected to a second end of the second resistor, a second end of the MOS transistor, and a first end of the branch where the dial switch is disposed, and an output end of the driving circuit, and a second end of the branch where the dial switch is disposed is grounded.

The present disclosure aims to solve a problem that existing display panel is easy to generate static electricity due to testing lines. An electrostatic protection circuit of the display panel is provided to protect a whole display panel by reducing a generation of the static electricity.

The present disclosure provides the driving circuit and the display panel. The driving circuit includes the power control module and the output control module, wherein the output end of the power control module is connected to the input end of the output control module. The output control module includes the first resistor, the second resistor, the third resistor, and the switching control unit. Wherein, the switching control unit connected in series with the third resistor is connected in parallel with the second resistor and then connected in series with the first resistor. When the driving circuit is in the first state, the switching control unit is turned off, the branch where the third resistor is disposed is disconnected, the first resistor and the second resistor are connected in series, and the driving circuit outputs the voltage Vout1. When the driving circuit is in the second state, the switching control unit is turned on, the branch where the third resistor is disposed is turned on, the third resistor is connected in parallel with the second resistor and then connected with the first resistor. The driving circuit outputs the voltage Vout2. Wherein, the absolute value of the Vout2 is greater than the absolute value of the Vout1. In an embodiment of the present disclosure, the switching control unit is provided in the driving circuit. When the display panel is in a lighting test state and the driving circuit is in the second state, the driving circuit outputs a lighting test voltage higher than a normal output voltage, thereby increasing the test voltage of the lighting test, so that the minor damage to the light board of the mini LED can be exposed in time during the lighting test. It is conducive to timely remove the defective products, improve a quality of the shipments, and reduce the occurrence of customer complaints or returns.

BRIEF DESCRIPTION OF DRAWINGS

Technical solutions and other beneficial effects of the present disclosure will be made obvious by describing specific implementation manners of the present disclosure in detail below in conjunction with accompanying drawings.

DETAILED DESCRIPTION OF EMBODIMENTS

The present disclosure provides a driving circuit and a display device. A test voltage of a lighting test is increased, so that a minor damage to a light board of a mini LED can be exposed in time during the lighting test. It is conducive to timely remove defective products, improve a quality of shipments, and reduce an occurrence of customer complaints or returns. Detailed descriptions are given below. It should be noted that an order of description in the following embodiments is not meant to limit a preferred order of the embodiments.

Figure 1:
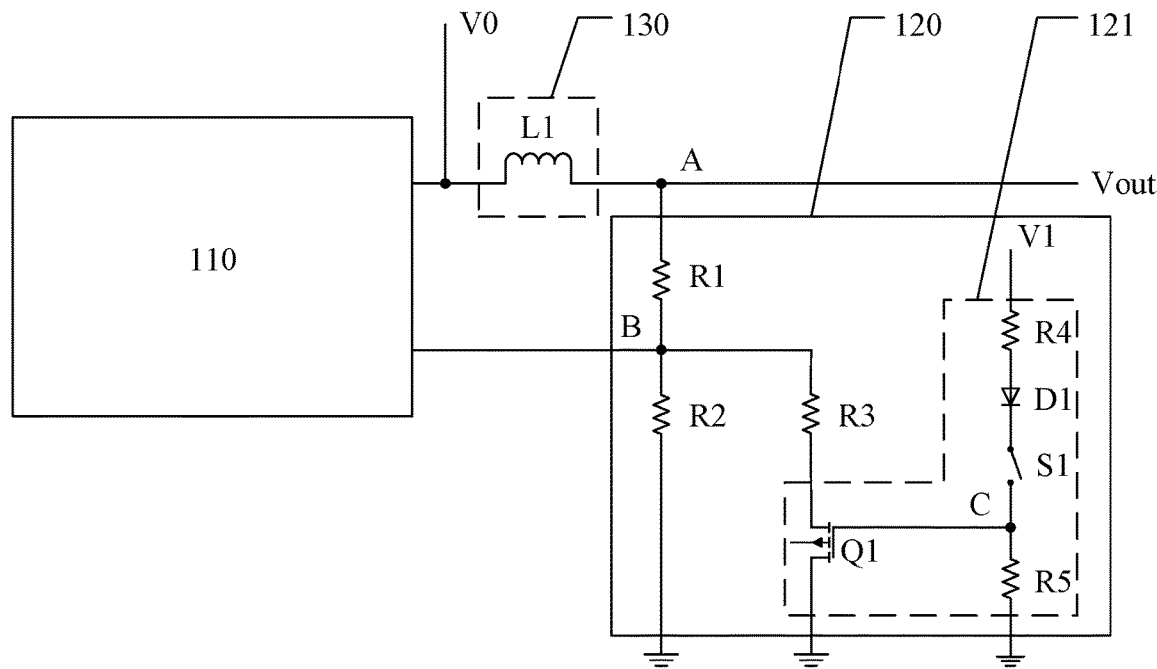
FIG. 1 is a first circuit diagram of a driving circuit according to an embodiment of the present disclosure.
Figure 2:
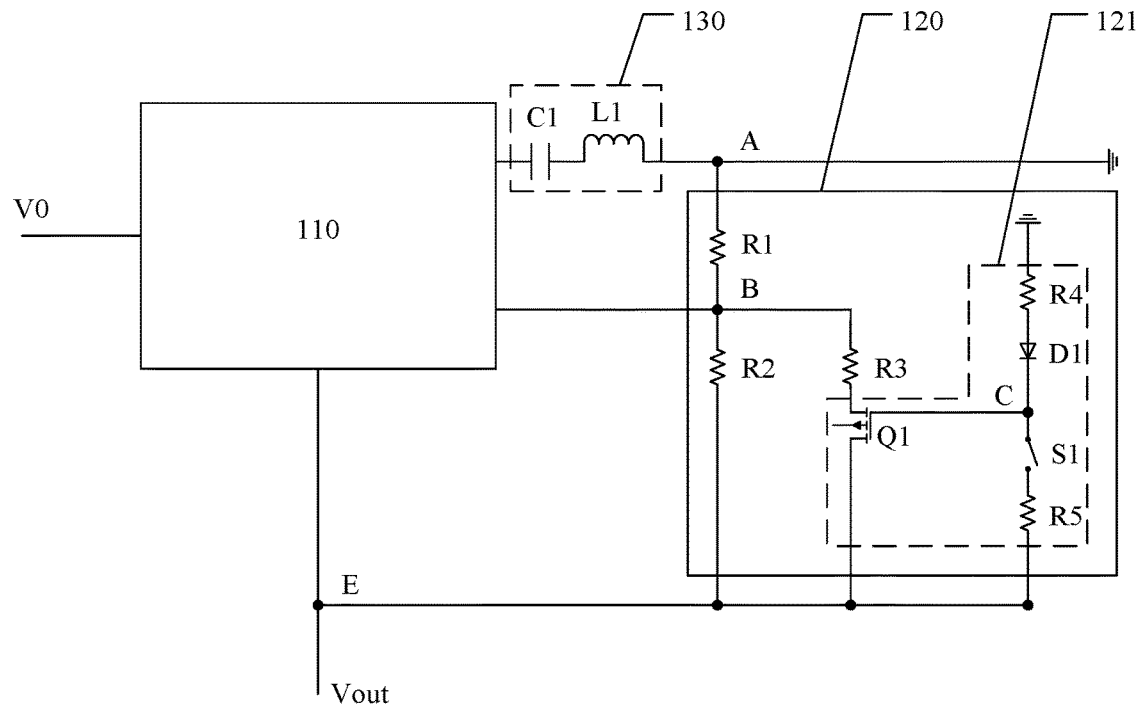
FIG. 2 is a second circuit diagram of the driving circuit according to an embodiment of the present disclosure.

In an embodiment, please refer to FIG. 1 and FIG. 2. FIG. 1 shows a first circuit diagram of a driving circuit provided by an embodiment of the present disclosure. FIG. 2 shows a second circuit diagram of the driving circuit provided by an embodiment of the present disclosure. As shown in the figures, the driving circuit provided by the embodiment of the present disclosure includes a power control module 110 and an output control module 120. An output end of the power control module 110 is connected to an input end of the output control module 120. The output control module 120 includes a first resistor R1, a second resistor R2, a third resistor R3, and a switching control unit 121. The switching control unit 121 is connected in series with the third resistor R3 and then connected in parallel with the second resistor R2, and then connected in series with the first resistor R1. When the driving circuit is in a first state, the switching control unit 121 is turned off, a branch where the third resistor R3 is disposed is disconnected, the first resistor R1 and the second resistor R2 are connected in series, and the driving circuit outputs a voltage Vout1. When the driving circuit is in a second state, the switching control unit 121 is turned on, the branch where the third resistor R3 is disposed is disconnected, the third resistor R3 is connected in parallel with the second resistor R2 and then connected in series with the first resistor R1, and the driving circuit outputs a voltage Vout2. An absolute value of the Vout2 is greater than an absolute value of the Vout1.

In an embodiment of the present disclosure, the switching control unit is provided in the driving circuit. When the display panel is in a lighting test state and the driving circuit is in the second state, the driving circuit outputs a lighting test voltage higher than a normal output voltage, thereby increasing the test voltage of the lighting test, so that the minor damage to the light board of the mini LED can be exposed in time during the lighting test. It is conducive to timely remove the defective products, improve a quality of the shipments, and reduce the occurrence of customer complaints or returns.

In an embodiment, referring to FIG. 1, the driving circuit includes the power control module 110, the output control module 120, and a voltage stabilizing module 130. An input end of the power control module 110 is connected to a first end of the voltage stabilizing module 130, and an output end of the power control module 110 is connected to a first input end of the output control module 120. A second end of the voltage stabilizing module 130 is connected to a second input end of the output control module 120, and is connected to an output end of the driving circuit at a point A.

Wherein, the power control module 110 includes a power control chip, and the power control chip is used to control an output voltage of the power control module 110.

The voltage stabilizing module 130 includes an inductor L1. A first end of the inductor L1 is connected to the input end of the power control module 110, and is input an external input voltage V0, and a second end of the inductor L1, a second input end of the output control module 120, and the output end of the driving circuit are connected to the point A. The voltage stabilizing module 130 adopts the inductor L1 to filter a clutter in a voltage of the output control module 120, so as to ensure stability of a voltage that the driving circuit outputs.

The output control module 120 is configured to control a voltage Vout that the driving circuit outputs. The output control module 120 includes the first resistor R1, the second resistor R2, the third resistor R3, and the switching control unit 121. Wherein, a first end of the first resistor R1 is connected to the point A, that is, connected to the first input end of the output control module 120 and the output end of the driving circuit. A second end of the first resistor R1, the first end of the second resistor R2, and a first end of the third resistor R3 are connected to a point B, that is, connected to the first input end of the output control module 120 and the input end of the power control module 110. A second end of the second resistor R2 is grounded. A second end of the third resistor R3 is connected to the first end of the switching control unit 121. A second end of the switching control unit 121 is grounded.

Further, the switching control unit 121 includes a metal oxide semiconductor (MOS) transistor Q1, a fourth resistor R4, an indicator light D1, a dial switch S1, and a fifth resistor R5. Wherein, a first end of the MOS transistor Q1 is connected to the first end of the switching control unit 121, that is, connected to the second end of the third resistor R3, and a second end of the MOS transistor Q1 is grounded. A first end of the fourth resistor R4 is connected to an external voltage V1, a second end of the fourth resistor R4 is connected to a first end of the indicator light D1, and a second end of the fourth resistor R4 is connected to a first end of the indicator light D1. A second end of the indicator light D1 is connected to a first end of the dial switch S1, and a second end of the dial switch S1 is connected to a first end of the fifth resistor R5. A second end of the fifth resistor R5 is grounded. A gate electrode of the MOS transistor Q1, the second end of the dial switch S1, and the first end of the fifth resistor R5 are connected at a point C.

Wherein, the first end of the third resistor R3 is connected to the first end of the second resistor R2, and the second end of the third resistor R3 is grounded through the switching control unit 121. When the switching control unit 121 is turned on, a voltage of the first end of the third resistor R3 is consistent with the voltage of the first end of the second resistor R2, and a voltage of the second end of the third resistor R3 is consistent with a voltage of the first end of the second resistor R2. The third resistor R3 and the second resistor R2 can be regarded as being connected in parallel. When the switching control unit 121 is turned off, a branch where the third resistor R3 is disposed is open.

In addition, since the first resistor R1 and the second resistor R2 are both fixed-value resistors, the first resistor R1 and the second resistor R2 are divided in series to determine the voltage output by the driving circuit. A conduction state of a branch where the third resistor R3 is disposed is controlled by the switching control unit 121, thereby controlling the parallel state of the third resistor R3 and the second resistor R2, and a voltage division between two ends of the second resistor R2 can be adjusted, thereby adjusting the voltage Vout output by the driving circuit.

A conduction state of the switching control unit 121 is determined by a conduction state of the MOS transistor Q1, and a gate voltage of the MOS transistor Q1 is controlled by a branch generated in series by the fourth resistor R4, the indicator light D1, and the dial switch S1, and the fifth resistor R5. In this embodiment, the MOS transistor Q1 is an N-type transistor. When the gate electrode of the MOS transistor Q1 is at a high potential, the MOS transistor Q1 is turned on. When the gate electrode of the MOS transistor Q1 is at a low potential, the MOS transistor Q1 is turned off.

When the dial switch S1 is closed, a branch formed by the fourth resistor R4, the indicator light D1, the dial switch S1, and the fifth resistor R5 in series with each other is turned on. The external voltage V1 is input to the branch, and the external voltage V1 is a high potential voltage, for example, 5V can be selected. The second end of the fifth resistor R5 is grounded, and the first end of the fifth resistor R5 is at high potential, that is, the point C is at a high potential. The gate electrode of the MOS transistor Q1 is connected to the point C, and is also at a high potential. The MOS transistor Q1 is turned on, and the branch where the third resistor R3 is disposed is turned on, and the third resistor R3 is connected in parallel with the second resistor R2. At the same time, the indicator light D1 lights up to indicate that the switching control unit 121 is in an on state, and then indicates a corresponding voltage output state of the driving circuit.

Conversely, when the dial switch S1 is turned off, a branch formed by the fourth resistor R4, the indicator light D1, the dial switch S1, and the fifth resistor R5 in series with each other is disconnected. The second end of the fifth resistor R5 is grounded, and the first end of the fifth resistor R5 is at a ground potential, that is, the point C is at the ground potential. The gate electrode of the MOS transistor Q1 is connected at the point C, and is also at the ground potential. The MOS transistor Q1 is disconnected, and the branch where the third resistor R3 is disposed is disconnected. At the same time, the indicator light D1 is not lit to indicate that the switching control unit 121 is in an off state, and indicates the output voltage state of the driving circuit corresponding to this state.

In the embodiment, the MOS transistor Q1 can also be a P-type transistor. Correspondingly, the first end of the fourth resistor R4 is grounded, and the second end of the fifth resistor R5 is connected to an external low potential voltage.

In the embodiment, any one or two of the fourth resistor R4 and the indicator light D1 can also be selectively removed without affecting a normal operation of an entire switching control unit 121.

In the embodiment, the switching control unit 121 can also be directly replaced by a dial switch. A first end of the dial switch is connected to a second end of a third resistor, and the second end is grounded. When the dial switch is closed, the branch where the third resistor R3 is disposed is turned on, and the third resistor R3 is connected in parallel with the second resistor R2. When the dial switch is opened, the branch where the third resistor R3 is disposed is disconnected.

When the driving circuit is in the first state, the switching control unit 121 is turned off, and the branch where the third resistor R3 is disposed is disconnected, and the first resistor R1 and the second resistor R2 are connected in series. The voltage Vout1 output by the driving circuit is: Vout1=VB (1+R1/R2)

Wherein, VB is a voltage of the first end of the second resistor R2. R1 is a resistance value of the first resistor R1, and R2 is a resistance value of the second resistor R2. VB is usually a fixed voltage value, such as 0.6V.

When the driving circuit is in the second state, the switching control unit 121 is turned on. The branch where the third resistor R3 is disposed is turned on, and the second resistor R2 and the third resistor R3 being connected in parallel is connected in series with the first resistor R1. A voltage Vout2 output by the driving circuit is: Vout2=VB (1+R1×(R2+R3)/(R2×R3))

Wherein, the VB is the voltage of the first end of the second resistor R2. R1 is the resistance value of the first resistor R1, the R2 is a resistance value of the second resistor R2, and the R3 is a resistance value of the third resistor R3. The VB is usually the fixed voltage value, such as 0.6V.

It can be known from the above formula that the voltage Vout2 output by the driving circuit in the second state is greater than the voltage Vout1 output in the first state. In the embodiment of the present disclosure, the third resistor R3 can be the fixed value resistor or a sliding resistor. When the third resistor R3 is the fixed value resistor, the voltage Vout2 output by the driving circuit in the second state can be fixedly adjusted. When the third resistor R3 is the sliding resistor, according to specific requirements, the voltage Vout2 output by the driving circuit on the second state can be adjusted within a certain range.

When the driving circuit is in the first state, the display panel is on a normal state, and the voltage Vout1 output by the driving circuit at this time is the normal output voltage. When the driving circuit is in the second state, the display panel is in the lighting test state. At this time, the voltage Vout2 output by the driving circuit is the lighting test voltage, and the lighting test voltage is higher than the normal output voltage, that is, the driving circuit provided in the embodiment of the disclosure increases the test voltage during the lighting test, so that the minor damage to the light board of the mini LED can be exposed in time during the lighting test. It is conducive to timely remove the defective products, improve a quality of the shipments, and reduce the occurrence of customer complaints or returns.

In another embodiment, please refer to FIG. 2, the driving circuit includes the power control module 110, the output control module 120, and the voltage stabilizing module 130. The input end of the power control module 110 is connected to the external input voltage V0. A first output end of the power control module 110 is connected to the first end of the voltage stabilizing module 130. A second output end of the power control module 110 is connected to a first input end of the control module 120. A third output end of the power control module 110 is connected to the second input end of the output control module 120 and is connected to the output end of the driving circuit at a point. The second end of the voltage stabilizing module 130 and the output control module 120 are connected at the point A and are grounded.

Wherein, the power control module 110 includes the power control chip, the power control chip is configured to control the output voltage of the power control module 110, specifically to output to the output control module 12 by converting a positive external input voltage V0 to a negative voltage.

The voltage stabilizing module 130 includes a capacitor C1 and the inductor L1. A first end of the capacitor C1 is connected to a first output end of the power control module 110. A second end of the capacitor C1 is connected to the first output end of the inductor L1. The second end of the inductor L1 and the output control module 120 are connected at the point A and are grounded. The voltage stabilizing module 130 adopts the capacitor C1 and the inductor L1 to filter the clutter in the voltage of the output control module 120, so as to ensure the stability of a voltage that the driving circuit outputs.

The output control module 120 is configured to control a magnitude of the voltage Vout output by the driving circuit. The output control module 120 includes the first resistor R1, the second resistor R2, the third resistor R3, and the switching control unit 121. Wherein, the first end of the first resistor R1 is connected at the point A, that is, the first end of the first resistor R1 is grounded. The second end of the first resistor, the first end of the second resistor R2, and the first end of the third resistor R3 are connected at the point B, that is, connected to the first input end of the output control module 120 and the first output end of the power control module 110. The second end of the third resistor R3 and the second end of the switching control unit 121 are connected at a point E, that is, connected to the third output end of the power control module 110, the second input end of the output control module 120, and the output end of the driving circuit. The third end of the switching control unit 121 is grounded.

Further, the switching control unit 121 includes the MOS transistor Q1, the fourth resistor R4, the indicator light D1, the dial switch S1, and the fifth resistor R5. Wherein, the first end of the MOS transistor Q1 is connected to the first end of the switching control unit 121, that is, to the second end of the third resistor R3. The second end of the MOS transistor Q1 is connected at the point E, that is, connected to the second end of the switching control unit 121 and the second end of the second resistor R2. The first end of the fourth resistor R4 is grounded, and the second end of the fourth resistor R4 is connected to the first end of the indicator light D1. The second end of the indicator light D1 is connected to the first end of the fifth resistor R5, and the second end of the dial switch S1 is connected to the first end of the fifth resistor R5. The second end of the fifth resistor R5 is connected at the point E, that is, connected to the second end of the switching control unit 121, and the gate electrode of the MOS transistor Q1 is connected to the second end of the indicator light D1, and the first end of the dial switch S1 is connected to the point C.

Wherein, the first end of the third resistor R3 is connected to the first end of the second resistor R2, and the second end of the third resistor R3 is connected to the second end of the third resistor R3 through the switching control unit 121. When the switching control unit 121 is turned on, a voltage of the first end of the third resistor R3 is equal to a voltage of the first end of the second resistor R2, and a voltage of the second end of the third resistor R3 is equal to a voltage of the first end of the second resistor R2, which can be regarded as the third resistor R3 and the second resistor R2 are connected in parallel. When the switching control unit 121 is disconnected, a branch where the third resistor R3 is disposed is open.

In addition, since the first resistor R1 and the second resistor R2 are both fixed-value resistors, the first resistor R1 and the second resistor R2 are divided in series to determine the voltage output by the driving circuit. The conduction state of the branch where the third resistor R3 is disposed is controlled by the switching control unit 121, thereby controlling the parallel state of the third resistor R3 and the second resistor R2, and the voltage division between the two ends of the second resistor R2 can be adjusted, thereby adjusting the voltage Vout output by the driving circuit.

The conduction state of the switching control unit 121 is determined by the conduction state of the MOS transistor Q1, and the gate voltage of the MOS transistor Q1 is controlled by the branch generated in series by the fourth resistor R4, the indicator light D1, and the dial switch S1, and the fifth resistor R5. In this embodiment, the MOS transistor Q1 is a P-type transistor. When the gate electrode of the MOS transistor Q1 is at a low potential, the MOS transistor Q1 is turned on. When the gate electrode of the MOS transistor Q1 is at a high potential, and the MOS transistor Q1 is turned off.

When the dial switch S1 is closed, the branch circuit formed by the fourth resistor R4, the indicator light D1, the dial switch S1, and the fifth resistor R5 in series with each other is turned on. The third output end of the power control module 110 inputs a low-potential negative voltage to the output control module 120. The first end of the fourth resistor R4 is grounded, and the second end of the fourth resistor R4 is at a negative low potential. The point C is at a negative low potential. The gate electrode of the MOS transistor Q1 is connected to the point C, and is also at a negative low potential. The MOS transistor Q1 is turned on, and the branch where the third resistor R3 is disposed is turned on, and the third resistor R3 is connected in parallel with the second resistor R2. At the same time, the indicator light D1 lights up to indicate that the switching control unit 121 is in an on state, and then indicates the corresponding voltage output state of the driving circuit.

Conversely, when the dial switch S1 is turned off, a branch formed by the fourth resistor R4, the indicator light D1, the dial switch S1, and the fifth resistor R5 in series with each other is disconnected. The first end of the fourth resistor R4 is grounded, and the first end of the fourth resistor R4 is at a ground potential, that is, the point C is at the ground potential. The gate electrode of the MOS transistor Q1 is connected at the point C, and is also at the ground potential. The MOS transistor Q1 is disconnected, and the branch where the third resistor R3 is disposed is disconnected. At the same time, the indicator light D1 is not lit to indicate that the switching control unit 121 is in an off state, and indicates the output voltage state of the driving circuit corresponding to this state.

In the embodiment, any one or two of the fifth resistor R5 and the indicator light D1 can also be selectively removed without affecting a normal operation of an entire switching control unit 121.

In the embodiment, the switching control unit 121 can also be directly replaced by a dial switch. A first end of the dial switch is connected to a second end of a third resistor, and the second end is grounded. When the dial switch is closed, the branch where the third resistor R3 is disposed is turned on, and the third resistor R3 is connected in parallel with the second resistor R2. When the dial switch is opened, the branch where the third resistor R3 is disposed is disconnected.

When the driving circuit is in the first state, the switching control unit 121 is turned off, and the branch where the third resistor R3 is disposed is disconnected, and the first resistor R1 and the second resistor R2 are connected in series. The voltage Vout1 output by the driving circuit is: Vout1=VB(1+R1/R2)

Wherein, VB is a voltage of the first end of the second resistor R2. R1 is a resistance value of the first resistor R1, and R2 is a resistance value of the second resistor R2. VB is usually a fixed voltage value, such as −0.6V.

When the driving circuit is in the second state, the switching control unit 121 is turned on. The branch where the third resistor R3 is disposed is turned on, and the second resistor R2 and the third resistor R3 being connected in parallel is connected in series with the first resistor R1. A voltage Vout2 output by the driving circuit is: Vout2=VB (1+R1×(R2+R3)/(R2×R3))

Wherein, the VB is the voltage of the first end of the second resistor R2. R1 is the resistance value of the first resistor R1, the R2 is a resistance value of the second resistor R2, and the R3 is a resistance value of the third resistor R3. The VB is usually the fixed voltage value, such as −0.6V.

It can be known from the above formula that the absolute value of the voltage Vout2 output by the driving circuit in the second state is greater than the absolute value of the voltage Vout1 output in the first state. In the embodiment of the present disclosure, the third resistor R3 can be the fixed value resistor or a sliding resistor. When the third resistor R3 is the fixed value resistor, the voltage Vout2 output by the driving circuit in the second state can be fixedly adjusted. When the third resistor R3 is the sliding resistor, according to specific requirements, the voltage Vout2 output by the driving circuit in the second state can be adjusted within a certain range.

When the driving circuit is in the first state, the display panel is on a normal state, and the voltage Vout1 output by the driving circuit at this time is the normal output voltage. When the driving circuit is in the second state, the display panel is in the lighting test state. At this time, the voltage Vout2 output by the driving circuit is the lighting test voltage, and the lighting test voltage is higher than the normal output voltage, that is, the driving circuit provided in the embodiment of the disclosure increases the test voltage during the lighting test, so that the minor damage to the light board of the mini LED can be exposed in time during the lighting test. It is conducive to timely remove the defective products, improve a quality of the shipments, and reduce the occurrence of customer complaints or returns.

Correspondingly, an embodiment of the present disclosure further provides the display device, and the display device includes any one of the drive circuits provided in the embodiments of the present disclosure, and includes technical features and technical effects of any one of the drive circuits provided in the embodiments of the present disclosure. Please refer to the above specific embodiments for the specific implementation and working principle of the technical features and technical effects, which will not be repeated here.

The present disclosure provides the driving circuit and the display panel. The driving circuit includes the power control module and the output control module, wherein the output end of the power control module is connected to the input end of the output control module. The output control module includes the first resistor, the second resistor, the third resistor, and the switching control unit. Wherein, the switching control unit connected in series with the third resistor is connected in parallel with the second resistor and then connected in series with the first resistor. When the driving circuit is in the first state, the switching control unit is turned off, the branch where the third resistor is disposed is disconnected, the first resistor and the second resistor are connected in series, and the driving circuit outputs the voltage Vout1. When the driving circuit is in the second state, the switching control unit is turned on, the branch where the third resistor is disposed is turned on, the third resistor is connected in parallel with the second resistor and then connected with the first resistor. The driving circuit outputs the voltage Vout2. Wherein, the absolute value of the Vout2 is greater than the absolute value of the Vout1. In an embodiment of the present disclosure, the switching control unit is provided in the driving circuit. When the display panel is in a lighting test state and the driving circuit is in the second state, the driving circuit outputs a lighting test voltage higher than a normal output voltage, thereby increasing the test voltage of the lighting test, so that the minor damage to the light board of the mini LED can be exposed in time during the lighting test. It is conducive to timely remove the defective products, improve a quality of the shipments, and reduce the occurrence of customer complaints or returns.

The above are only examples of the present disclosure and do not limit the scope of the present disclosure. Any equivalent structure or equivalent process transformation made using the description and drawings of the present disclosure, or directly or indirectly applied to other related technical fields, are included in the scope of patent protection of the present disclosure.

What is claimed is:

1. A driving circuit, comprising: a power control module and an output control module, wherein an output end of the power control module is connected to an input end of the output control module, and the output control module comprises:
   a first resistor;
   a second resistor;
   a third resistor; and
   a switching control unit, wherein the switching control unit connected in series with the third resistor is connected in parallel with the second resistor and then connected in series with the first resistor;
   when the driving circuit is in a first state, the switching control unit is turned off, a branch where the third resistor is disposed is disconnected, the first resistor and the second resistor are connected in series, and the driving circuit outputs a voltage Vout1;
   when the driving circuit is in a second state, the switching control unit is turned on, the branch where the third resistor is disposed is turned on, the third resistor is connected in parallel with the second resistor and then connected in series with the first resistor, and the driving circuit outputs a voltage Vout2;
   wherein an absolute value of the Vout2 is greater than an absolute value of the Vout1;
   wherein the switching control unit comprises a metal oxide semiconductor (MOS) transistor, a dial switch, and a fifth resistor, wherein the dial switch and the fifth resistor are connected in series to form a first branch, the MOS transistor is connected in series with the third resistor, and a gate of the MOS transistor is connected to the first branch; and
   wherein a first end of the first branch is connected to an input voltage, a second end of the first branch is grounded, and the dial switch is disposed between a voltage input end of the first branch and the gate of the MOS transistor.

2. The driving circuit as claimed in claim 1, wherein a first end of the dial switch is connected to the input voltage, a second end of the dial switch is connected to a first end of the fifth resistor and the gate of the MOS transistor, and a second end of the fifth resistor is grounded.

3. The driving circuit as claimed in claim 1, wherein the switching control unit further comprises an indicator light and a fourth resistor, and the dial switch, the fourth resistor, the indicator light, and the fifth resistor are connected in series.

4. The driving circuit as claimed in claim 3, wherein a first end of the fourth resistor is connected to the input voltage, a second end of the fourth resistor is connected to a first end of the indicator light, a second end of the indicator light is connected to a first end of the dial switch, a second end of the dial switch is connected to a first end of the fifth resistor and the gate of the MOS transistor, and a second end of the fifth resistor is grounded.

5. The driving circuit as claimed in claim 3, wherein a first end of the fourth resistor is connected to the input voltage, a second end of the fourth resistor is connected to a first end of the dial switch, a second end of the dial switch is connected to a first end of the indicator light and the gate of the MOS transistor, a second end of the indicator light is connected to a first end of the fifth resistor, and a second end of the fifth resistor is grounded.

6. The driving circuit as claimed in claim 1, wherein an input end of the power control module is connected to a first external power source, and is connected to a first end of the first resistor and an output end of the driving circuit, the output end of the power control module is connected to a second end of the first resistor, a first end of the second resistor, and a first end of the third resistor, a second end of the second resistor is grounded, a first end of the MOS transistor is connected to a second end of the third resistor, a second end of the MOS transistor is grounded, and the first end of the first branch is connected to a second external power source.

7. The driving circuit as claimed in claim 6, wherein the driving circuit further comprises a voltage stabilizing module, an end of the voltage stabilizing module is connected to the power control module, and another end of the voltage stabilizing module is connected to the first end of the first resistor to ensure stability of the voltage output by the driving circuit.

8. The driving circuit as claimed in claim 7, wherein the voltage stabilizing module comprises at least one of a capacitor or an inductor.

9. The driving circuit as claimed in claim 1, wherein an input end of the power control module is connected to a first external power source, a first output end of the power control module is connected to a first end of the first resistor and grounded, a second output end of the power control module is connected to a second end of the first resistor, a first end of the second resistor, and a first end of the third resistor, a first end of the MOS transistor is connected to a second end of the third resistor, and a third output end of the power control module is connected to a second end of the second resistor, a second end of the MOS transistor, the first end of the first branch, and an output end of the driving circuit.

10. A display device, comprising a driving circuit, wherein the driving circuit comprises: a power control module and an output control module, wherein an output end of the power control module is connected to an input end of the output control module, and the output control module comprises:
a first resistor;
a second resistor;
a third resistor; and
a switching control unit, wherein the switching control unit connected in series with the third resistor is connected in parallel with the second resistor and then connected in series with the first resistor;
when the driving circuit is in a first state, the switching control unit is turned off, a branch where the third resistor is disposed is disconnected, the first resistor and the second resistor are connected in series, and the driving circuit outputs a voltage Vout1;
when the driving circuit is in a second state, the switching control unit is turned on, the branch where the third resistor is disposed is turned on, the third resistor is connected in parallel with the second resistor and then connected in series with the first resistor, and the driving circuit outputs a voltage Vout2;
wherein an absolute value of the Vout2 is greater than an absolute value of the Vout1;
wherein the switching control unit comprises a metal oxide semiconductor (MOS) transistor, a dial switch, and a fifth resistor, wherein the dial switch and the fifth resistor are connected in series to form a first branch, the MOS transistor is connected in series with the third resistor, and a gate of the MOS transistor is connected to the first branch; and
wherein a first end of the first branch is connected to an input voltage, a second end of the first branch is grounded, and the dial switch is disposed between a voltage input end of the first branch and the gate of the MOS transistor.

11. The display device as claimed in claim 10, wherein a first end of the dial switch is electrically connected to the voltage input end, and a second end of the dial switch is electrically connected to a first end of the fifth resistor, and the gate of the MOS transistor.

12. The display device as claimed in claim 11, wherein an input end of the power control module is connected to a first external power source, and is connected to a first end of the first resistor and an output end of the driving circuit, the output end of the power control module is connected to a second end of the first resistor, a first end of the second resistor, and a first end of the third resistor, a second end of the second resistor is grounded, a first end of the MOS transistor is connected to a second end of the third resistor, a second end of the MOS transistor is grounded, and the first end of the first branch is connected to a second external power source.

13. The display device as claimed in claim 11, wherein an input end of the power control module is connected to a first external power source, a first output end of the power control module is connected to a first end of the first resistor and grounded, a second output end of the power control module is connected to a second end of the first resistor, a first end of the second resistor, and a first end of the third resistor, a first end of the MOS transistor is connected to a second end of the third resistor, and a third output end of the power control module is connected to a second end of the second resistor, a second end of the MOS transistor, the first end of the first branch, and an output end of the driving circuit.

* * * * *